United States Patent
Guo (10) Patent No.: US 11,393,552 B2
(45) Date of Patent: Jul. 19, 2022

(54) METHOD, APPARATUS AND ELECTRONIC DEVICE FOR TEXTING MEMORY, AND COMPUTER-READABLE STORAGE MEDIUM

(71) Applicants: Beijing Baidu Netcom Science and Technology Co., Ltd., Beijing (CN); Kunlunxin Technology (Beijing) Company Limited, Beijing (CN)

(72) Inventor: Ziyu Guo, Beijing (CN)

(73) Assignees: Beijing Baidu Netcom Science and Technology Co., Ltd., Beijing (CN); Kunlunxin Technology (Beijing) Company Limited, Beijing (CN)

( * ) Notice: Subject to any disclaimer, the term of this patent is extended or adjusted under 35 U.S.C. 154(b) by 0 days.

(21) Appl. No.: 17/213,717

(22) Filed: Mar. 26, 2021

(65) Prior Publication Data

US 2021/0217483 A1    Jul. 15, 2021

(30) Foreign Application Priority Data

Jul. 20, 2020   (CN) .......................... 202010701037.2

(51) Int. Cl.
   *G11C 29/56*    (2006.01)
(52) U.S. Cl.
   CPC .................................. *G11C 29/56* (2013.01)

(58) Field of Classification Search
   CPC ......... G11C 29/56; G11C 29/12; G11C 29/48; G11C 29/26; G11C 2029/0401; G11C 2029/2602
   See application file for complete search history.

(56) References Cited

U.S. PATENT DOCUMENTS

| | | | |
|---|---|---|---|
| 6,021,515 A * | 2/2000 | Shimura | G01R 31/31813 714/738 |
| 6,735,730 B1 | 5/2004 | Fujiwara et al. | |
| 8,572,444 B2 * | 10/2013 | Lee | G11C 29/42 714/719 |
| 2006/0059386 A1 | 3/2006 | Han et al. | |
| 2008/0201622 A1 | 8/2008 | Hiew et al. | |
| 2019/0115091 A1 | 4/2019 | Seok et al. | |

FOREIGN PATENT DOCUMENTS

| CN | 109346119 A | 2/2019 |
|---|---|---|
| WO | 2010066207 A1 | 6/2010 |

* cited by examiner

*Primary Examiner* — Mohammed A Bashar
(74) *Attorney, Agent, or Firm* — The Webb Law Firm (57) ABSTRACT

Methods, apparatuses and electronic devices for testing a memory of a chip are provided. Specifically, the chip includes a plurality of operation modules, the operation module includes at least one operation unit, and the operation unit includes at least one memory. The method includes generating a first test vector for a first operation module of the operation modules, and testing the memory in the first operation module by using the generated first test vector independent of other operation modules of plurality of operation modules, where the other operation modules are different from the first operation module.

17 Claims, 6 Drawing Sheets

METHOD, APPARATUS AND ELECTRONIC DEVICE FOR TEXTING MEMORY, AND COMPUTER-READABLE STORAGE MEDIUM

CROSS-REFERENCE TO RELATED APPLICATION

This application claims priority to Chinese Patent Application No. 202010701037.2 filed Jul. 20, 2020, the disclosure of which is hereby incorporated by reference in its entirety.

BACKGROUND OF THE INVENTION

Field of the Invention

The present disclosure relates generally to the field of chips, and more particularly, to a method, apparatus, and electronic device for testing a memory of a chip, and to a computer-readable storage medium.

Description of Related Art

With the rapid development of artificial intelligence, the functionality and computing power of Artificial Intelligence (AI) chips, such as the System-on-chip (SoC), are becoming increasingly powerful, resulting in a dramatic increase in scale and complexity of the AI chip designs. A large number of memories, such as a Static Random Access Memory (SRAM), a Dynamic Random Access Memory (DRAM), a high speed CACHE, a register, and a FLASH memory, are embedded in an existing AI chip. These memories are arranged at various locations on the chip to support various logical operations.

Due to many reasons in the manufacturing process of the chip, such as process flow, design, etc., part of the memory on the chip cannot operate correctly. Thus, prior to chip leave the factory, Memory Built-In-Scan-Test (MBIST) are typically performed on the memory of the chip to test the validity of the memory and to replace/repair the damaged memory.

SUMMARY OF THE INVENTION

Schemes for testing a memory of a chip are provided in the present disclosure.

In a first aspect of the present disclosure, there is provided a method for testing a memory of a chip, wherein the chip includes a plurality of operation modules, the operation module includes at least one operation unit, the operation unit includes at least one memory, the method comprising: generating a first test vector for a first operation module of the operation modules; and testing the memory in the first operation module by using the generated first test vector, independently of other operation modules of the plurality of operation modules, wherein the other operation modules are different from the first operation module.

In a second aspect of the present disclosure, there is provided an apparatus for testing a memory of a chip, wherein the chip includes a plurality of operation modules, the operation module includes at least one operation unit including at least one memory. The apparatus includes a first test vector generation module configured to generate a first test vector for a first operation module of plurality of operation modules; and a first memory test module configured to perform a memory test for the first operation module with the generated first test vector, independent of other operation modules different from the first operation module of the plurality of operation modules.

In a third aspect of the present disclosure, there is provided an electronic device including one or more processors; and a memory for storing one or more programs that, when executed by one or more processors, cause the electronic device to implement the method according to the first aspect of the present disclosure.

In a fourth aspect of the present disclosure, there is provided a computer readable storage medium having a computer program stored thereon which, when executed by a processor, implements a method according to the first aspect of the present disclosure.

It is to be understood that the description in this section does not intend to identify key or critical features of the embodiments of the disclosure, nor does it intend to limit the scope of the disclosure. Other features of the present disclosure will become readily apparent from the following description.

BRIEF DESCRIPTION OF THE DRAWINGS

The above and other features, advantages and aspects of the present disclosure will become more apparent from the following detailed description when taken in conjunction with the accompanying drawings. It is to be understood that the drawings are for a better understanding of the present disclosure and are not construed as limiting the application. In the drawings, the same or similar figures denote the same or similar elements, wherein.

The technique according to the present disclosure solves the problem that the conventional scheme for testing the memory, such as a MBIST, cannot meet an AI chip design and manufacturing requirement due to poor flexibility and long-time consumption. According to the present disclosure, there is provided an improved scheme for testing of the memory of the chip, which can improve flexibility in testing the memory in an AI chip, reduce pressure on a period and a time limit of testing memory in the chip, reduce time required for performing memory testing, and reduce manufacturing and producing costs of the chip.

DESCRIPTION OF THE INVENTION

Exemplary embodiments of the present disclosure are described below in connection with the accompanying drawings, in which various details of the embodiments of the present disclosure are included to facilitate understanding, and are to be considered as exemplary only. Accordingly, one of ordinary skill in the art will recognize that various changes and modifications may be made to the embodiments described herein without departing from the scope and spirit of the present disclosure. Also, for clarity and conciseness, descriptions of well-known functions and structures are omitted from the following description.

In the description of the embodiments of the present disclosure, the term "comprising" and its analogous terms are to be understood as open-ended, i.e., "including, but not limited to." The term "based on" is to be understood as "based at least in part on." The term "one embodiment" or "the embodiment" is to be understood as "at least one embodiment". The terms "first", "second" and the like can denote the same or different objects; Other explicit and implicit definitions may also be included below.

As used herein, the term "chip" refers to a physical carrier implemented by any existing or future development of software or hardware and combinations thereof. In certain application scenarios, it includes, but is not limited to, "SoC," "crystal," "wafer," "bare wafer," "integrated circuit," "monolithic device," "semiconductor device," "microelectronic device," and the like.

As used herein, the term "operation unit" refers to a unit in a chip that implements a basic operation algorithm or function, which may be implemented by any existing or future development of software or hardware or a combination thereof. Various basic operations in the chip may be implemented by an operation unit, including for example, but not limited to, convolution, numerical operations, vector operations, matrix operations, character operations, and the like.

As used herein, the term "operation module" refers to a module in a chip, which implements certain functions or operations, and may be implemented by any existing or future development of software or hardware and combinations thereof. The operation module may include a plurality of operation units, for example, the operation module may include a plurality of operation units in the form of an array. The operation module can quickly perform complex and repetitive operations to meet the requirements of the AI algorithm for computing power.

As mentioned above, the AI chip is embedded with a large amount of memories (such as SRAM, DRAM, CACHE, FLASH, etc.). In order to test the validity of the embedded memory and to replace/repair the damaged memory, the memory in the chip is typically MBIST before the chip leaving the factory.

The conventional MBIST scheme is executed only after the entire chip design is completed, and is performed in a flat test manner in which all memories in the chip are tested as a whole without distinguishing the memories in the chip when performing the MBIST test.

As the functionality and computing power of the AI chip is enhanced, the number of memories embedded in the AI chip also increases dramatically. This results in a relatively long time to perform one test for all memories in the chip. In particular, when an iterative MBIST test needs to be performed, the MBIST test will require a large amount of time, increasing the manufacturing cost of the chip. In addition, as the number of chip memories increases drastically, the test vectors for MBIST testing become more and more complex. More importantly, when any one of the operation module/functional units in the chip needs to be adjusted, all the memories of the whole chip need to be retested, which results in many unnecessary tests, and operation flexibility is poor.

It can be seen that, without increasing or prolonging the chip design and manufacturing cycle, the conventional MBIST scheme cannot meet the requirement of executing the test for the memory of the corresponding AI chip. Accordingly, there is a need for an efficient and flexible memory testing scheme to meet the need for testing the memory of an AI chip.

The inventors first note that, with the complexity of AI chip functions, a single AI chip typically includes a plurality of operation modules, which are typically designed and implemented independently of each other. By way of example only, an AI chip for image processing may include at least one vector operation module and at least one displacement operation sub-module. The above-described operation modules may be completed independently of each other by different design teams.

Second, the inventors note that the existing AI chip has a regular structure and has a layer-by-layer distribution characteristic. Specifically, the AI chip may include a plurality of operation modules, each of which includes a plurality of operation units, wherein each operation unit includes a plurality of corresponding memories.

In addition, the inventors note that the structure of the AI chip has high repeatability. Specifically, the operation modules of the same function may have the same structure. By way of example only, one AI chip for image processing may include a plurality (e.g., six) of convolution operation modules having the same structural function. Further, each operation module may include a plurality of operation units of the same structure and function, and by way of example only, the convolution operation module may be an array of convolution operation units of a size 1024*512.

Moreover, the inventors also note that, in an existing AI chip, each operation unit may include a circuit for executing a corresponding operation logic and a plurality of memories corresponding thereto, the plurality of memories being generally arranged in the vicinity of the circuit for executing the corresponding operation logic so as to realize rapid data interaction. A plurality of memories belonging to the same operation unit may be divided into a plurality of groups based on specific criteria such as location, type, size, test requirements, and the like of the memories, and the MBIST tests may be performed in parallel with each other among the plurality of groups.

Based on the above understanding, the present disclosure proposes an improved scheme for testing (e.g., MBIST) a memory for a chip. According to an embodiment of the present disclosure, the testing of the memories for the chip does not have to be performed together after the design of all the sub-modules (i.e., the operation modules) of the chip is completed, instead the testing are performed in advance and independently during the design and manufacture of each operation module. Specifically, during the design and manufacture of the operation modules of the chip, a test vector is designed and generated for the current operation module to complete the test of the memory. In this way, the memory test does not need to be performed after all the operation modules are designed, and the pressure of the test period and time limit of the MBIST is relieved.

Furthermore, since the testing is performed for a single operation module rather than the all modules, the design complexity of the test vector may be reduced. Further, since the testing for each operation module in the chip can be performed independently, it is not necessary to test all memory units of the chip when adjusting one operation module, which avoids unnecessary testing. Thus, the present disclosure provides an efficient and flexible memory testing scheme.

Figure 1:
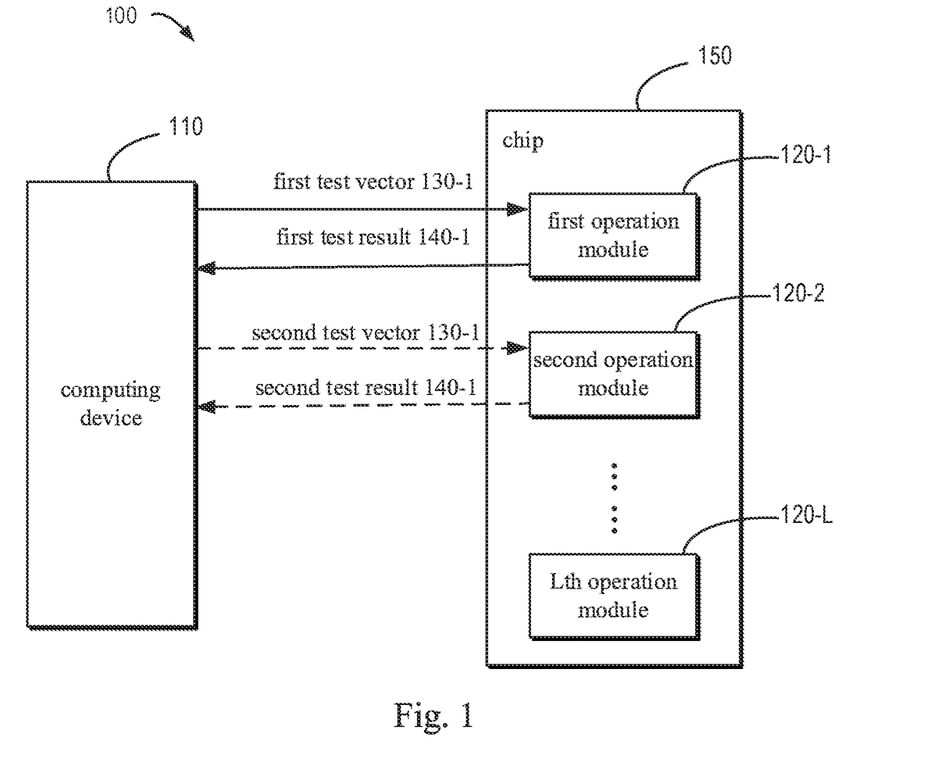
FIG. 1 illustrates a schematic diagram of an example environment in which a test scheme for a memory of a chip is implemented according to embodiments of the present disclosure.

Embodiments of the present disclosure will be described in detail below with reference to the accompanying drawings. FIG. 1 illustrates a schematic diagram of an exemplary environment 100 in which various embodiments of the present disclosure may be implemented. The example environment 100 includes a computing device 110 and a chip 150. The chip 150 includes a first operation module 120-1, a second operation module 120-2, and an Lth operation module 120-L. The first operation module 120-1, the second operation module 120-2, and the Lth operation module 120-L are operation modules to be tested in the chip, and may be, for example, a convolutional operation module, a displacement operation module, or the like, which may be designed independently of each other. For ease of description, the plurality of operation modules 120-1, 120-2 to 120-L may be collectively referred to as operation module 120.

The computing device 110 is a testing device that performs the memory test, and may be, for example, a MBIST control device, or the like. As shown in FIG. 1, the computing device 110 inputs the first test vector 130-1 to the first operation module 120-1 and receives the first test result 140-1 of the first operation module 120-1, and inputs the second test vector 130-2 to the second operation module 120-2 and receives the second test result 140-2 of the second operation module 120-2. Based on the first test result 140-1, the computing device 110 may obtain the test result as to whether the memory in the first operation module 120-1 is valid. Based on the second test result 140-2, the computing device 110 may obtain the test result as to whether the memory in the second operation module 120-2 is valid. Further, when it is determined that there is a damaged memory, the computing device 110 may replace or repair the damaged memory.

For ease of description, a plurality of test vectors, e.g., the first test vector 130-1 and the second test vector 130-2, may be collectively referred to as a test vector 130; a plurality of test results, for example, the first test result 140-1 and the second test result 140-2, may be collectively referred to as a test result 140. It will be appreciated that the test for the first operation module 120-1 and the test for the second operation module 120-2 are independent of each other and may be performed at different time periods depending on the design and manufacturing requirements.

In some embodiments, the test vector 130 and the test result 140 may be interacted between the computing device 110 and the computing module 120 by wired or wireless communication. In some exemplary embodiments, the computing device 110 may generate a test vector 130. Alternatively, in other exemplary embodiments, the computing device 110 may also receive a test vector 130 input by the user through an input device (including, but not limited to, a mouse, a keyboard, a touch pen, a touch screen, etc.) coupled to the computing device 110.

It should be understood that the number of computing device 110 and operation module 120 shown in FIG. 1 is merely exemplary and not limiting, and in other embodiments, the number of computing device 110 and operation module 120 is any other data, and the present disclosure is not limited in this respect.

It should also be understood that the test vector 130 and the test result 140 may be communicated between the computing device 110 and the computing module 120 through one or more interactions depending on the particular application scenario, and the present disclosure is not limited in this respect.

Figure 2:
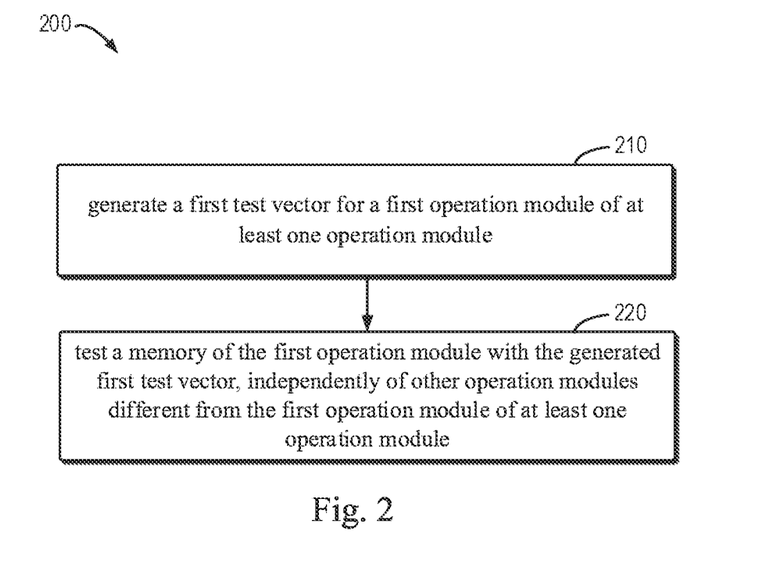
FIG. 2 illustrates a flow diagram of a test process for a memory of a chip according to various embodiments of the present disclosure.

A test process for a memory of a chip according to the present disclosure will be described in more detail below with reference to FIG. 2. FIG. 2 illustrates a flow diagram of a process 200 for testing the memory in the chip according to various example embodiments of the present disclosure. The process 200 may be implemented by the computing device 110 of FIG. 1. For ease of discussion, the process 200 will be described in conjunction with FIG. 1.

At block 210, the computing device 110 generates a first test vector 130-1 for the first operation module 120-1 in the chip 150.

At block 220, the computing device 110 performs the memory test for the first operation module 120-1 with the generated first test vector 130-1 independently of other operation modules (e.g., the second operation module 120-1 to the Lth operation module) in the chip 150. Specifically, the first test vector 130-1 is output to the first operation module 120-1 and the first test result 140-1 returned by the first operation module 120-1 is received.

In this manner, as compared to the conventional memory test scheme, the memory test of the first operation module 120-1 may be performed during the design and manufacture of the first operation module 120-1 without waiting for the completion of the entire chip 150 to be designed. Furthermore, the complexity of the test vectors is reduced without having to design the test vectors for all the memories of the entire chip 150. Finally, when the memory test is performed again after the adjustment of the first operation module 120-1, it is not necessary to perform an unwanted test on the memory of other operation modules.

In some embodiments, the first test vector 130-1 may be reused by another operation module. For example, the computing device 110 determines whether another operation module (e.g., the second operation module 120-2) and the first operation module 120-1 satisfy the first criterion. If the first criterion is satisfied, the computing device 110 reuses the first test vector 130-1 when performing a memory test for the second operation module 120-2. If the computing device 110 determines that the second operation module 120-2 and the first operation module 120-1 do not satisfy the first criterion, the computing device 110 generates a second testing vector 130-2 different from the first testing vector 130-1 for the second operation module 120-2 when performing the memory test for the second operation module 120-2, and performs the memory test for the second operation module 120-2 with the generated second testing vector 130-2.

In some embodiments, the first criterion is that the second operation module 120-2 has the same structure or operation function as the first operation module 120-1.

By way of example only, an AI chip for performing an image processing function may include a plurality of convolutional operation arrays having the same or at least similar structure and a plurality of displacement operation arrays having the same or at least similar structure. Based on the similarity between the above structures, the test vectors may be reused between the plurality of convolution operation arrays or displacement operation arrays.

In this manner, the design complexity of the test vector 130 is further reduced.

It will be appreciated that, the memory test for the first operation module 120-1 being independently of that for the second operation module 120-2 means that the test operations between the two are independent of each other and does not necessarily mean that the tests for the first operation module 120-1 and for the second operation module 120-2 cannot overlap in time. In some embodiments, memory testing for the first operation module 120-1 and for the second operation module 120-2 may be performed in parallel or in series depending on the particular application scenario (e.g., the number of pins included in the chip 150 for MBIST, test requirements for the operation module 120, test costs, etc.).

As discussed above, the first operation module 120-1 may include a plurality of operation units. Returning to FIG. 2, a test scheme for the memories of the chip of the present disclosure is further described below. At block 210, the computing device 110 may generate a sub-test vector for one operation unit in the first operation module 120-1, and generate the first test vector 130-1 by reusing the generated sub-test vector among all the operation units in the first operation module 120-1. At block 220, the computing device 110 performs a memory test for the first operation module 120-1 by performing a corresponding memory sub-test for each operation unit in the first operation module 120-1. In some embodiments, different memory sub-tests are performed in parallel, and in other embodiments, different memory sub-tests are performed serially.

Figure 3:
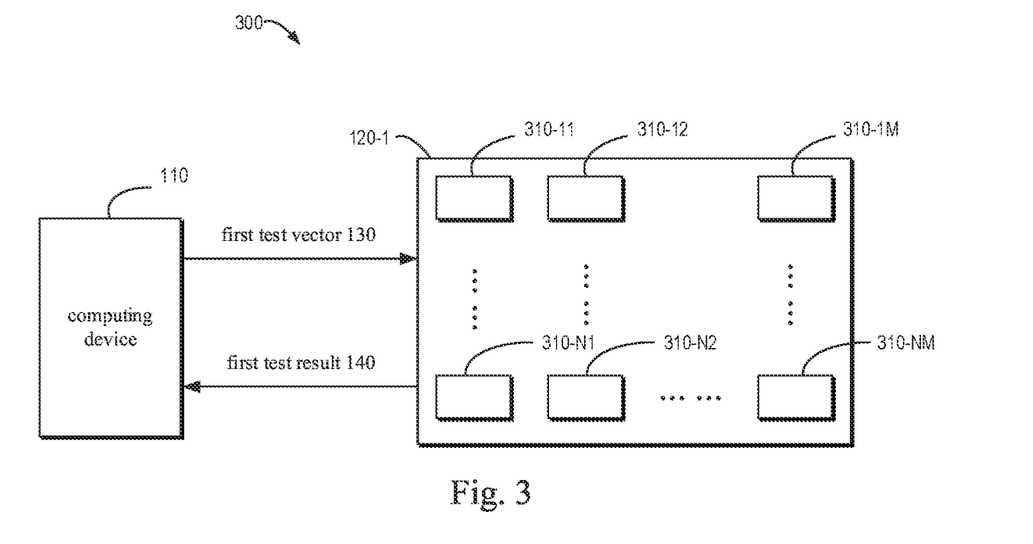
FIG. 3 illustrates a schematic diagram of another example environment in which a test scheme for a memory of a chip is implemented according to embodiments of the present disclosure.

Referring now to FIG. 3, a further description will be made for a scheme in which the computing device 110 performs a memory test in the first operation module 120-1. FIG. 3 illustrates a schematic diagram of another exemplary environment 300 in which the test scheme according to various embodiments of the present disclosure may be implemented. As shown in FIG. 3, the first operation module 120-1 includes a plurality of operation units 310-11, 310-12 . . . 310-1M; . . . ; 310-N1, 310-N2 . . . 310-NM, where N and M are positive integers. That is, the first operation module 120-1 is an array of operation units of M*N. For convenience of description, a plurality of operation units 310-11, 310-12 . . . 310-1M; . . . ; 310-N1, 310-N2 . . . 310-NM may be collectively referred to as the operation unit 310.

In some embodiments, the computing device 110 may generate sub-test vector for one operation unit 310 in the first operation module 120-1, for example, the operation unit 310-11, and generate the first test vector 130-1 by reusing the generated sub-test vector among all the operation units 310 in the first operation module 120-1. In the exemplary embodiment shown in FIG. 3, the generated sub-test vector may be reused M*N times.

In some embodiments, for different operation units 310 (operation units 310-11, 310-12 . . . 310-1M in FIG. 3; . . . ; 310-N1, 310-N2, . . . 310-NM), the plurality of memory sub-tests to be implemented may be performed in parallel. In other embodiments, different memory sub-tests may be performed in serial.

In this way, the same/similar characteristics of structure and function between different operation units 310 belonging to the same operation module 120 are fully utilized, and the design of the test vector is further simplified. In addition, different memory sub-tests may be performed in parallel or in serial according to specific application scenarios (e.g., the number of pins for MBIST included in the chip 150, test requirements of the operation module 120, test costs, etc.), further improving the efficiency of the memory test.

As discussed above, each operation unit 310 includes a circuit for executing the corresponding operation logic and a plurality of memories, wherein the plurality of memories are typically arranged in the vicinity of the circuit for executing the corresponding operation logic to enable rapid data interaction. A plurality of memories belonging to the same operation unit may be divided into a plurality of groups based on specific criteria such as location, type, size, test requirements, and the like of the memories. Depending on the above-described characteristics of the operation unit 310, the memory test for the chip may be further improved.

Figure 4:
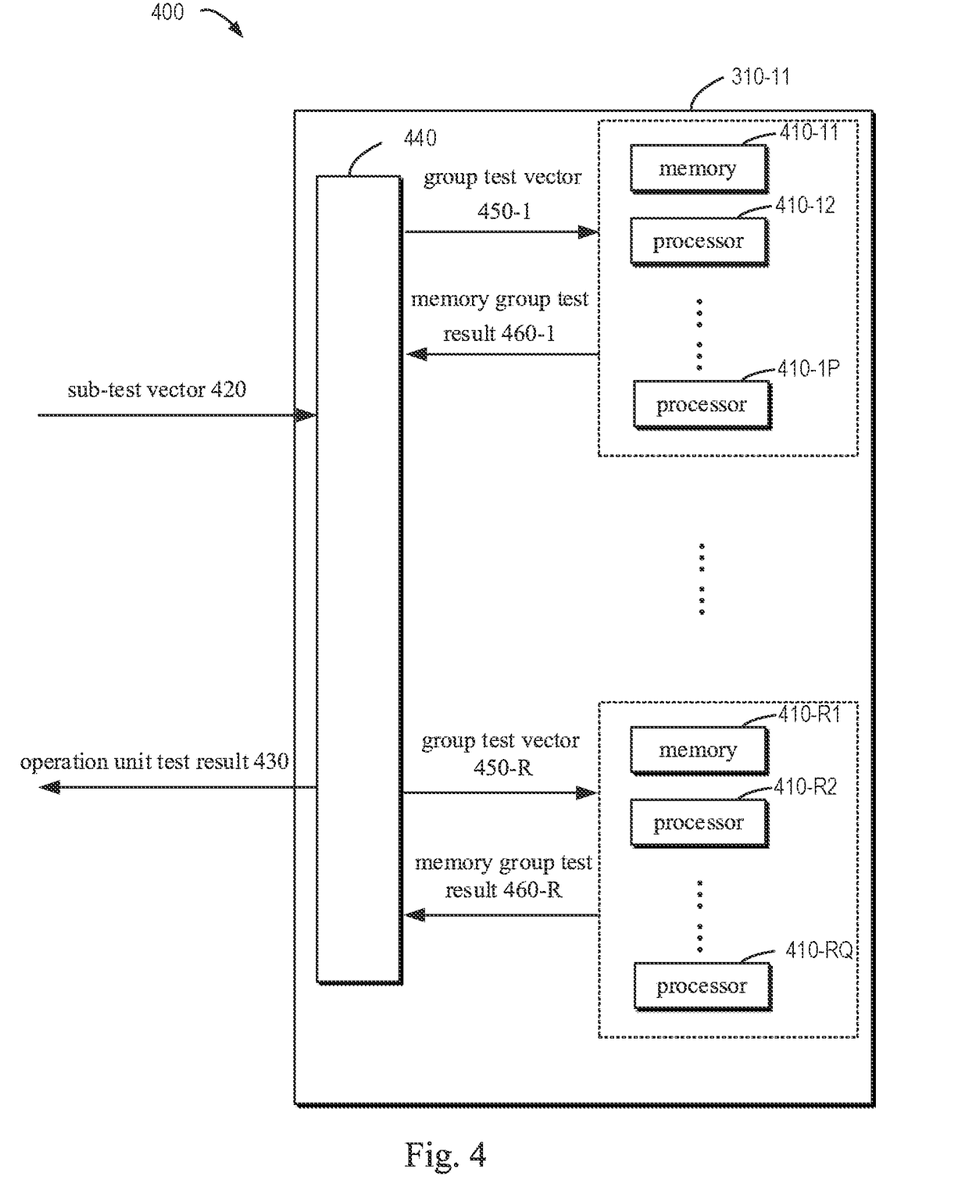
FIG. 4 illustrates a schematic diagram of an example environment in which a test scheme of a memory for an operation unit of a chip is implemented according to embodiments of the present disclosure.

With reference to FIG. 4, a further description will be made for a scheme in which the computing device 110 performs a memory test for the operation unit 310. FIG. 4 illustrates a schematic diagram of an exemplary environment 400 in which a test scheme for the memory of the operation unit 310 according to various embodiments of the present disclosure is implemented. As shown in FIG. 4, the operation unit 310-11 includes a plurality of memories 410-11, 410-12, . . . 410-1P; . . . 410-R1, 410-R2, . . . 410-RQ, wherein R and Q are positive integers. For ease of description, a plurality of memories 410-11, 410-12, . . . 410-1P; . . . 410-R1, 410-R2, . . . 410-RQ may be collectively referred to as memory 410.

Alternatively or additionally, in some embodiments, the operation unit 310-11 may be arranged with a test controller 440. The test controller 440 may be implemented as part of the computing device 110, or may be designed as a module or entity that is independent of the computing device 110. The test controller 440 receives the sub-test vector 420 and returns the test result 430 of the operation unit 310 to the corresponding device. In some embodiments, the test controller 440 may be implemented as a MBIST controller.

In some embodiments, the memory 410 in the computing unit 310 is divided into a plurality of memory groups according to a second criterion.

In some embodiments, the computing device 110 may divide the memories 410 into a plurality of groups based on the location of memory 410. For example, the computing device 110 divides the memories 410 located adjacent to each other into a group.

Alternatively or additionally, the computing device 110 may divide the memories 410 into a plurality of groups depending on the type of memories 410 (such as SRAM, DRAM, CACHE, FLASH, etc.). For example, the computing device 110 divides all SRAM-type memories into one group and all registers into another group.

As shown in FIG. 4, the memories 410 in the calculation unit 310-11 are divided into R groups of memories, wherein 410-11, 410-12, . . . 410-1P are divided into one group and the memories 410-R1, 410-R2, . . . 410-RQ are divided into another group.

It should be understood that the basis for dividing the memory 410 by the computing device 110 is not limited to the examples discussed above, and in other embodiments, can be also based on the size of the memory, the test cost of the MBIST, etc., the present disclosure is not limited in this respect.

In some embodiments, each memory group includes 10-12 memories.

In some embodiments, the computing device 110 generates respective group test vector 450 for each of the divided groups.

In some embodiments, the test controller 440 performs a memory group test for each group based on the divided groups, and different memory group tests are performed in parallel. As shown in FIG. 4, the test controller 440 receives the sub-test vector 420 and generates a group test vector 450-1 for the first memory group and a group test vector 450-R for the Rth memory group based on the sub-test vector 420. The test controller 440 performs memory group tests in parallel among the first memory group and the Rth memory group.

In some embodiments, the test controller 440 receives the memory group test results 460-1 and 460-R and returns them to the corresponding device as the test result of the operation unit 430.

In this manner, memories belonging to the same computing unit 310 are divided into different memory groups, and memory group tests are performed among different memory groups in a parallel manner, so that the performance of the memory tests is improved.

Further, in the AI chip, some common memories (such as some low-speed memories) not included in any of the operation modules 120 may be also included. In addition, each operation module 120 includes some common memories (such as some low-speed memories) for the operation module 120 in addition to the memories arranged in the respective operation unit 310. In some embodiments, the computing device 110 may divide these common memories into a plurality of operation modules according to a predetermined criteria, including, but not limited to, location, type, test requirements, and the like, and perform memory tests for the above-described common memories according to the memory testing methods of the present disclosure.

In some embodiments, the read/write rate of the memory test has been controlled by assistance of a corresponding clock control module when performing the memory test.

It should be understood that any existing or future method for designing the test vector may be employed in designing a specific test vector value, and any existing or future method for wiring may be employed in performing the memory test, and the present disclosure is not limited in this respect.

In addition, it should be understood that the method of the present disclosure is also applicable to processes such as chip emulation, development, and simulation, in addition to the design and manufacture processes of the AI chip.

By the embodiment of the present disclosure, unlike the conventional flat-based MBIST method, the embodiments of the present disclosure employs a hierarchical memory test technique to perform the MBIST test in advance, to the design and fabrication stage of the operation module 120 of the chip, thereby relieving the pressure of the test period and the test time limit of the MBIST and reducing the complexity of the test vector design. Further, since the testing of the memory 410 of each operation module 120 can be performed independently, it is not necessary to perform unnecessary testing for the memories 410 of the other operation module when there is an adjustment of one operation module and needs to perform the memory testing again.

In addition, the test vectors are reused between the operation modules 120 of the same function and between the multiple operation units 310 of the same operation module 120, further reducing the complexity of the test vector design.

Further, the present disclosure groups the memories 410 in the same operation unit 310, and performs in parallel memory group tests among different memory groups using different test vectors, thereby further shortening the memory test time and reducing the production and manufacturing costs of the chips.

Figure 5:
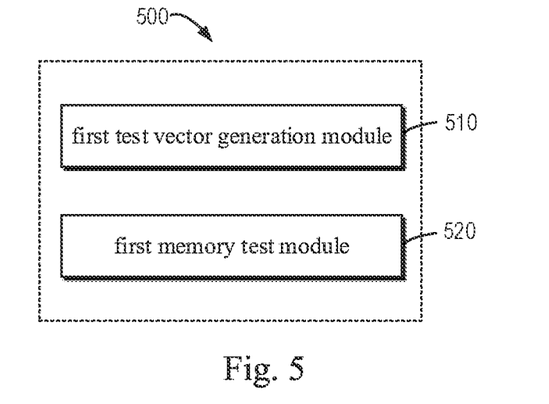
FIG. 5 illustrates a schematic block diagram of an apparatus for testing a memory of a chip according to embodiments of the present disclosure.

FIG. 5 shows a schematic block diagram of an apparatus 500 for memory testing of a chip according to embodiments of the present disclosure. The apparatus 500 may be included in or implemented as the computing device 110 as shown in FIG. 1. As shown in FIG. 5, the apparatus 500 includes a first test vector generation module 510 configured to generate a first test vector 130-1 for a first operation module 120-1 in at least one operation module. The apparatus 500 may further include a first memory test module 520 configured to perform a memory test for the first operation module 120-1 by using the generated first test vector 130-1 independently of other operation modules in the operation module 120, which are different from the first operation module 120-1.

In some embodiments, if the second operation module 120-2 of the other operation modules and the first operation module 120-1 satisfy the first criteria, the apparatus 500 further includes a second memory test module configured to perform a memory test for the second operation module 120-2 by using the first test vector 130-1; and if the second operation module 120-2 and the first operation module 120 do not satisfy the first criterion, the apparatus 500 further includes a second test vector generating module configured to generate a second test vector for the second operation module 120-2; and a third memory test module configured to perform a memory test for the second operation module 120-2 by using the generated second test vector 130-2, which is different from the first test vector 130-1, independently of the other operation modules.

In some embodiments, the first criterion is that the second operation module 120-2 has the same structure or operation function as the first operation module 120-1.

In some embodiments, the first test vector generation module 510 includes a sub-test vector generation module configured to generate the sub-test vector 420 for one operation unit 310 in the operation module; and a sub-test vector reuse module configured to generate the first test vector 130-1 by reusing the sub-test vector 420 among all the operation units 310 in the first operation module 120-1.

In some embodiments, the apparatus 500 further includes a first memory division module configured to divide the memories 410 in the operation unit into at least one group according to a second criterion. The sub-test vector generation module includes a group test vector generation module configured to generate a respective group test vector 450 for each divided group respectively; and a group test vector synthesis module configured to generate a sub-test vector 420 based on the generated group test vector 450.

In some embodiments, the first memory division module includes a first memory group division module configured to divide at least one memory 420 in the operation unit into at least one group according to a location and type of the at least one memory.

In some embodiments, the first memory test module includes a memory sub-test module configured to perform memory tests for the first operation module 120-1 by performing corresponding memory sub-tests for each operation unit 310 of the first operation module 120-1, wherein the different memory sub-tests are performed in parallel or in series.

In some embodiments, the apparatus 500 further comprises a second memory division module configured to divide at least one memory 420 in the operation unit 310 into at least one group according to a third criterion, wherein the memory sub-test module further performs memory sub-tests by performing respective memory group test for each of the divided group, wherein the different memory group tests are performed in parallel.

In some embodiments, the second memory division module includes a second memory group division module configured to divide at least one memory 420 in the operation unit 310 into at least one group according to a location and type of the at least one memory 420.

Figure 6:
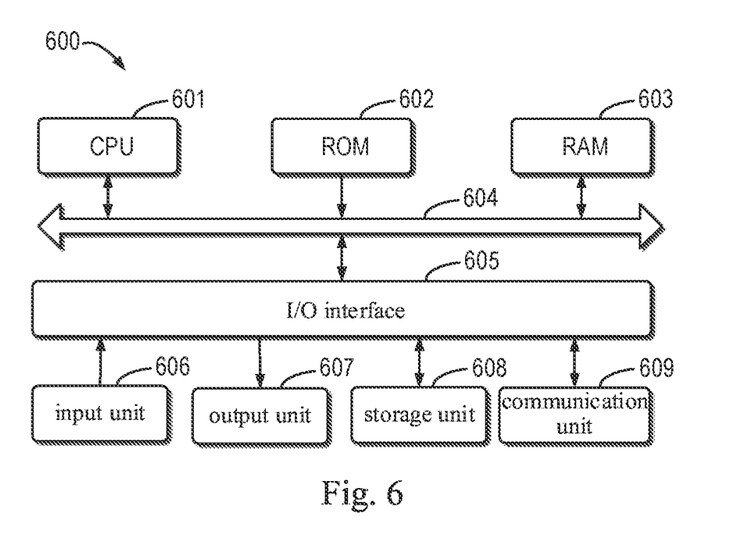
FIG. 6 illustrates a block diagram of an apparatus for memory testing of a chip according to embodiments of the present disclosure.

FIG. 6 illustrates a schematic block diagram of an exemplary device 600 that may be used to implement embodiments of the present disclosure. The device 600 may be used to implement the image processing device 130 as shown in FIG. 1. As shown, the apparatus 600 includes a Central Processing Unit (CPU) 601, which may perform various appropriate actions and processes according to computer program instructions stored in a Read Only Memory (ROM) 602 or computer program instructions loaded into a Random Access Memory (RAM) 603 from a storage unit 608. In RAM 603, various programs and data required for operation of the device 600 may also be stored. CPU 601, ROM 602, and RAM 603 are connected to each other via bus 604. An Input/Output (I/O) interface 605 is also connected to bus 604.

A plurality of components in the device 600 are connected to the I/O interface 605, including an input unit 606, such as a keyboard, a mouse, and the like; an output unit 607, for example, various types of displays, speakers, and the like; a storage unit 608, such as a magnetic disk, an optical disk, or the like; and a communication unit 609, such as a network card, a modem, or a wireless communication transceiver. The communication unit 609 allows the device 600 to exchange information/data with other devices over a computer network such as the Internet and/or various telecommunications networks.

Processing unit 601 performs the various methods and processes described above, such as process 400. For example, in some embodiments, process 200 may be implemented as a computer software program tangibly embodied in a machine-readable medium, such as storage unit 608. In some embodiments, some or all of the computer program may be loaded and/or installed on the device 600 via the ROM 602 and/or the communication unit 609. When the computer program is loaded into the RAM 603 and executed by the CPU 601, one or more steps of the process 400 described above may be performed. Alternatively, in other embodiments, the CPU 601 may be configured to execute the process 400 by any other suitable means (e.g., by means of firmware).

The functions described above herein may be performed at least in part by one or more hardware logic components. For example, without limitation to the present disclosure, exemplary types of hardware logic components that may be used include Field Programmable Gate Arrays (FPGA), Application Specific Integrated Circuits (ASIC), Application Specific Standard Products (ASSP), System-On-Chip (SOC), complex programmable logic devices (CPLDs), and the like.

The program code for carrying out the methods of the present disclosure may be written in any combination of one or more programming languages. These program codes may be provided to a processor or controller of a general purpose computer, special purpose computer, or other programmable data processing apparatus such that the program code, when executed by the processor or controller, causes the functions/operations specified in the flowchart and/or block diagram to be implemented. The program code may be executed entirely on the machine, partly on the machine, partly on the machine as a stand-alone software package and partly on the remote machine or entirely on the remote machine or server.

In the context of the present disclosure, a machine-readable medium may be a tangible medium that may contain or store a program for use by or in connection with an instruction execution system, apparatus, or device. The machine-readable medium may be a machine-readable signal medium or a machine-readable storage medium. The machine-readable medium may include, but is not limited to, electronic, magnetic, optical, electromagnetic, infrared, or semiconductor systems, apparatus, or devices, or any suitable combination of the foregoing. More specific examples of machine-readable storage media may include one or more wire-based electrical connections, portable computer disks, hard disks, Random Access Memory (RAM), Read Only Memory (ROM), Erasable Programmable Read Only Memory (EPROM or flash memory), optical fibers, portable Compact Disk Read Only Memory (CD-ROM), optical storage devices, magnetic storage devices, or any suitable combination of the foregoing.

The systems and techniques described herein may be implemented in a computing system including a background component (e.g., as a data server), or a computing system including a middleware component (e.g., an application server), or a computing system including a front-end component (e.g., a user computer having a graphical user interface or a web browser through which a user may interact with embodiments of the systems and techniques described herein), or a computing system including any combination of such background component, middleware component, or front-end component. The components of the system may be interconnected by any form or medium of digital data communication (e.g., a communication network). Examples of communication networks include a Local Area Network (LAN), a Wide Area Network (WAN), and the Internet.

The computer system may include a client and a server. The client and server are typically remote from each other and typically interact through a communication network. The relationship between the client and the server is generated by a computer program running on the corresponding computer and having a client-server relationship with each other.

Furthermore, although operations are depicted in a particular order, this should not be understood to require that such operations be performed in the particular order shown or in a sequential order, or that all illustrated operations should be performed to achieve the desired results. In certain circumstances, multitasking and parallel processing may be advantageous. Likewise, while several specific implementation details have been included in the above discussion, these should not be construed as limiting the scope of the disclosure. Certain features described in the context of separate embodiments may also be implemented in combination in a single implementation. Conversely, various features described in the context of a single implementation may also be implemented in multiple implementations alone or in any suitable sub-combination.

Although the subject matter has been described in language specific to structural features and/or methodological logical acts, it is to be understood that the subject matter defined in the appended claims is not necessarily limited to the specific features or acts described above. Rather, the specific features and acts described above are merely exemplary forms of implementing the claims.

What is claimed is:

1. A method for testing a memory in a chip, wherein the chip comprises a plurality of operation modules comprising at least one operation unit, and wherein the operation unit comprises at least one memory, and the method comprises:
generating a first test vector for a first operation module of the operation modules;
testing the memory in the first operation module by using the generated first test vector, independently of other operation modules of the plurality of operation modules, wherein the other operation modules are different from the first operation module;

testing the memory on a second operation module of the other operation modules by using the first test vector, in response to determining that the second operation module and the first operation module satisfy a first criterion; and generating, in response to determining that the second operation module and the first operation module do not satisfy the first criterion, a second test vector for the second operation module, and testing the memory in the second operation module by using the generated second test vector independently of the other operation modules, wherein the second test vector is different from the first test vector.

2. The method of claim 1, wherein the first criterion is that the second operation module has the same structure or operation function as the first operation module.

3. The method of claim 1, wherein generating the first test vector comprises:
generating a sub-test vector for one operation unit of the operation module; and
generating the first test vector by reusing the sub-test vector between all operation units in the first operation module.

4. The method of claim 3, further comprising:
dividing memories in the operation unit into at least one group according to a second criterion,
wherein generating the sub-test vector comprises:
generating a respective group test vector for each divided group; and
generating the sub-test vector based on the generated group test vector.

5. The method of claim 4, wherein dividing the memories in the operation unit into at least one group according to a second criterion comprises:
dividing memories in the operation unit into the at least one group according to location and type of the memories.

6. The method of claim 1, wherein testing the memory in the first operation module comprises:
testing the memory in the first operation module by performing respective memory sub-test in each operation unit of the first operation module, wherein different memory sub-tests are performed in parallel or in series with each other.

7. The method of claim 6, further comprising:
dividing memories in the operation unit into at least one group according to a third criterion, wherein performing the respective memory sub-test for each operation unit comprises:
the memory sub-tests are performed by testing a respective memory group for each divided group, wherein different memory group tests are performed in parallel.

8. The method of claim 7, wherein dividing the memories in the operation unit into the at least one group according to the third criterion comprises:
dividing the memories in the operation unit into the at least one group according to location and type of the memories.

9. An electronic device comprising:
one or more processors; and
a memory for storing one or more programs which, when executed by the one or more processors, cause the processor to perform operations comprising:

generating a first test vector for a first operation module of the operation modules;

testing the memory in the first operation module by using the generated first test vector, independently of other operation modules of the plurality of operation modules, wherein the other operation modules are different from the first operation module;

testing the memory on a second operation module of the other operation modules by using the first test vector, in response to determining that the second operation module and the first operation module satisfy a first criterion; and generating, in response to determining that the second operation module and the first operation module do not satisfy the first criterion, a second test vector for the second operation module, and testing the memory in the second operation module by using the generated second test vector independently of the other operation modules, wherein the second test vector is different from the first test vector.

10. The device of claim 9, wherein the first criterion is that the second operation module has the same structure or operation function as the first operation module.

11. The device of claim 9, wherein generating the first test vector comprises:
generating a sub-test vector for one operation unit of the operation module; and
generating the first test vector by reusing the sub-test vector between all operation units in the first operation module.

12. The device of claim 11, wherein the operations comprise:
dividing memories in the operation unit into at least one group according to a second criterion,
wherein generating the sub-test vector comprises:
generating a respective group test vector for each divided group; and
generating the sub-test vector based on the generated group test vector.

13. The device of claim 12, wherein dividing the memories in the operation unit into at least one group according to a second criterion comprises:
dividing memories in the operation unit into the at least one group according to location and type of the memories.

14. The device of claim 9, wherein testing the memory in the first operation module comprises:
testing the memory in the first operation module by performing respective memory sub-test in each operation unit of the first operation module, wherein different memory sub-tests are performed in parallel or in series with each other.

15. The device of claim 14, wherein the operations comprise:
dividing memories in the operation unit into at least one group according to a third criterion, wherein performing the respective memory sub-test for each operation unit comprises:
the memory sub-tests are performed by testing a respective memory group for each divided group, wherein different memory group tests are performed in parallel.

16. The device of claim 15, wherein dividing the memories in the operation unit into the at least one group according to the third criterion comprises:
dividing the memories in the operation unit into the at least one group according to location and type of the memories.

17. A non-transitory computer readable storage medium having a computer program stored thereon which, when executed by a processor, a cause the process to perform operations comprising:
- generating a first test vector for a first operation module of the operation modules;
- testing the memory in the first operation module by using the generated first test vector, independently of other operation modules of the plurality of operation modules, wherein the other operation modules are different from the first operation module;
- testing the memory on a second operation module of the other operation modules by using the first test vector, in response to determining that the second operation module and the first operation module satisfy a first criterion; and
- generating, in response to determining that the second operation module and the first operation module do not satisfy the first criterion, a second test vector for the second operation module, and testing the memory in the second operation module by using the generated second test vector independently of the other operation modules, wherein the second test vector is different from the first test vector.

* * * * *